(12) United States Patent
Ying et al.

(10) Patent No.: US 12,009,250 B2
(45) Date of Patent: Jun. 11, 2024

(54) SEMICONDUCTOR DEVICE AND A METHOD MAKING THE SAME

(71) Applicant: ChangXin Memory Technologies, Inc., Hefei (CN)

(72) Inventors: Zhan Ying, Hefei (CN); Qiang Zhang, Hefei (CN); Yiming Zhu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 382 days.

(21) Appl. No.: 17/431,148

(22) PCT Filed: Mar. 26, 2021

(86) PCT No.: PCT/CN2021/083119
§ 371 (c)(1),
(2) Date: Aug. 13, 2021

(87) PCT Pub. No.: WO2021/232936
PCT Pub. Date: Nov. 25, 2021

(65) Prior Publication Data
US 2023/0120791 A1    Apr. 20, 2023

(30) Foreign Application Priority Data

May 20, 2020 (CN) .......................... 202010428538.8

(51) Int. Cl.
*H01L 21/762* (2006.01)
*H01L 21/308* (2006.01)
*H10B 12/00* (2023.01)

(52) U.S. Cl.
CPC .... *H01L 21/76224* (2013.01); *H01L 21/3086* (2013.01); *H10B 12/01* (2023.02)

(58) Field of Classification Search
CPC .......... H01L 21/76224; H01L 21/3086; H01L 21/3083; H01L 27/108; H01L 27/10897;
(Continued)

(56) References Cited

U.S. PATENT DOCUMENTS 7,564,084 B2    7/2009   Song et al.
9,337,101 B1 *  5/2016   Sung ................ H01L 21/31144
(Continued)

FOREIGN PATENT DOCUMENTS

CN          1983601 A         6/2007
CN       101577242 A         11/2009
(Continued)

OTHER PUBLICATIONS

PCT/CN2021/083119 International Search Report and Written Opinion dated Jun. 30, 2021, English translation of Search Report.
(Continued)

*Primary Examiner* — Mohammad A Rahman
(74) *Attorney, Agent, or Firm* — Sheppard Mullin Richter & Hampton LLP

(57) ABSTRACT

A method for manufacturing a semiconductor structure includes: providing a substrate, the substrate includes a plurality of first trenches and a first pattern having an array of lines each formed between adjacent two of the plurality of first trenches; forming a first dielectric layer to cover at least the sidewalls of each of the lines in the array of the first pattern; and each of the lines in the array of the first pattern is segmented to form elements of a second pattern.

19 Claims, 10 Drawing Sheets

(58) Field of Classification Search
CPC ... H01L 2924/1436; H01L 2924/14369; H01L 27/1023; H01L 28/40; H01L 28/92; G11C 11/401; G11C 11/4099; G11C 14/0009; G11C 14/0045; G11C 2211/4016; H10B 12/01; H10B 12/00; H10B 12/34; H10B 12/37; H10B 12/39; H10B 12/395; H10B 12/48; H10B 12/482; H10B 12/488

See application file for complete search history.

(56) References Cited

U.S. PATENT DOCUMENTS

| | | |
|---|---|---|
| 9,842,931 B1 | 12/2017 | Anderson et al. |
| 10,559,568 B1 | 2/2020 | Huang |
| 10,861,740 B2 | 12/2020 | Wang et al. |
| 2003/0017671 A1 | 1/2003 | Lee et al. |
| 2007/0051994 A1* | 3/2007 | Song ............... H10B 12/01 257/296 |
| 2012/0119289 A1 | 5/2012 | Kim |
| 2012/0126374 A1 | 5/2012 | Carollo et al. |
| 2015/0108601 A1 | 4/2015 | Kwon |
| 2016/0163543 A1 | 6/2016 | Kim et al. |
| 2017/0287907 A1* | 10/2017 | Apodaca ........... H01L 23/53257 |
| 2018/0006111 A1 | 1/2018 | Xie et al. |
| 2020/0091311 A1 | 3/2020 | Hsu et al. |

FOREIGN PATENT DOCUMENTS

| | | |
|---|---|---|
| CN | 104051346 A | 9/2014 |
| CN | 107230702 A | 10/2017 |
| CN | 107275286 A | 10/2017 |
| CN | 108807282 A | 11/2018 |
| CN | 112447582 A | 3/2021 |
| EP | 3944301 A1 | 1/2022 |
| WO | WO 2021/232936 A1 | 11/2021 |

OTHER PUBLICATIONS

EP 21785736.6 Extended European Search Report dated Jul. 15, 2022.

PCT International Preliminary Report on Patentability dated Dec. 1, 2022, issued in related International Application No. PCT/CN2021/083119, with English translation (9 pages).

PCT International Search Report and the Written Opinion dated Jun. 9, 2021, issued in related International Application No. PCT/CN2021/083131, with English translation (8 pages).

PCT International Preliminary Report on Patentability dated Dec. 1, 2022, issued in related International Application No. PCT/CN2021/083131, with English translation (9 pages).

Extended European Search Report dated Jul. 13, 2022, issued in related European Patent Application No. 21785747.3 (8 pages).

Examination Report dated Mar. 14, 2023, issued in related European Patent Application No. 21785747.3 (5 pages).

* cited by examiner

SEMICONDUCTOR DEVICE AND A METHOD MAKING THE SAME

CROSS REFERENCES TO RELATED APPLICATIONS

This application claims the benefit of priority to CN Patent Application CN 2020104285388 filed on May 20, 2020, entitled "A SEMICONDUCTOR DEVICE AND A METHOD MAKING THE SAME", the contents of both applications are incorporated herein by reference in its entirety.

TECHNICAL FIELD

The present application relates to a semiconductor device structure and a fabrication method making the same.

BACKGROUND

Dynamic random access memory (DRAM) is a kind of semiconductor memory devices widely used in multiple computer systems. With the development of semiconductor integrated circuit device technologies, the critical dimensions of the dynamic random access memory are getting ever smaller. For example, the active areas (AA) are becoming increasingly smaller, setting very high requirements for corresponding semiconductor manufacturing process.

SUMMARY

According to the present disclosure, one of the various embodiments discloses a method for manufacturing a semiconductor device structure, the method includes:
  providing a substrate which has a plurality of first trenches, and a first pattern is formed between two adjacent ones of the plurality of first trenches;
  forming a first dielectric layer, and the first dielectric layer covers at least the sidewall of the first pattern; and
  segmenting the first pattern to form a second pattern.

Another embodiment discloses a semiconductor devise structure, which includes:
  a substrate;
  a plurality of first trenches and a plurality of second trenches both disposed in the substrate:
  a second pattern disposed comprising the first trenches and the second trenches;
  a first dielectric layer disposed to cover at least sidewalls of the second pattern adjacent to the first trenches; and
  a second dielectric layer filling the second trenches.

The details of one or more embodiments of the disclosure are set forth in the following drawings and description. Other features and advantages of the disclosure will become apparent from the description, drawings and claims.

BRIEF DESCRIPTION OF THE DRAWINGS

By describing its exemplary embodiments in detail with reference to the accompanying drawings, the above and other objectives, features and advantages of the present disclosure will become more apparent.

In order to more clearly illustrate the technical solutions in the embodiments of the present application, the following will briefly introduce the drawings needed in the embodiments. Obviously, the drawings in the following description are only some embodiments of the present application For those of ordinary skill in the art, without creative work, other drawings can be obtained from these drawings.

Figure 1:
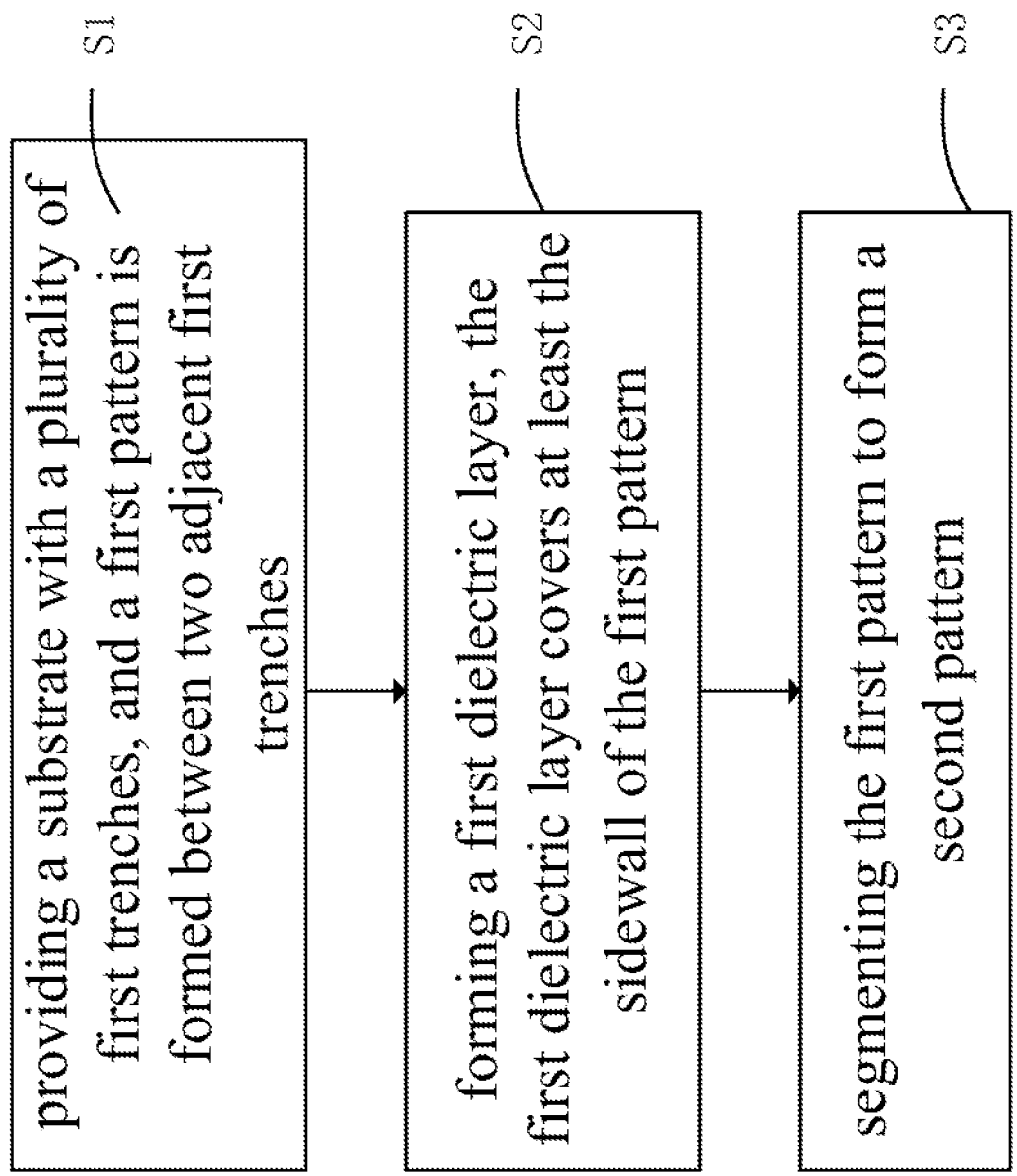
FIG. 1 is a flow chart of the method for preparing the semiconductor structure of the present disclosure.

Reference numerals in the figures: 1. Substrate; 11. First pattern; 111. Second pattern; 12. First trench; 112. Second trench; 2. First dielectric layer; 3. Patterned mask layer: 31. Opening pattern; 4. The second dielectric layer; and 5. The third dielectric layer.

DETAILED DESCRIPTION OF THE PREFERRED EMBODIMENTS

In order to better understand the purpose, technical solutions, and technical effects of the present disclosure, the present disclosure will be further explained below in conjunction with the accompanying drawings and embodiments. At the same time, it is stated that the embodiments described below are only used to explain the present disclosure, not to limit the present disclosure.

Unless otherwise defined, all technical and scientific terms used herein have the same meaning as commonly understood by those skilled in the technical field of the disclosure. The terminology used in the specification of the application herein is only for the purpose of describing specific embodiments, and is not intended to limit the application. The term "and/or" as used herein includes any and all combinations of one or more related listed items.

In the case of using the "including", "having", and "including" described in this article, unless a clear qualifying term is used, such as "only", "consisting of", etc., another component may be added Or method. Unless mentioned to the contrary, terms in the singular form may include the plural form, and it cannot be understood that the number is one.

In the existing semiconductor process, a one-step etching process is used to dry-etch the substrate to form shallow trenches in the substrate to isolate a number of active regions in the substrate, and then the shallow trenches are filled with an insulating material layer to form shallow trench isolation structures. When using the existing dry etching process to directly etch the substrate to form the active area, especially as the design dimensions decrease, the ends of the active area becomes more and more elongated, because the etching gas contains high-energy charged particles or groups, as the charged particles or groups bombard the substrate to form shallow trenches, they cause damage or destruction to the ends of the active regions, which will have an adverse effect on the performance of the device.

When the width of the active area becomes very small, using the existing etching process often damages the ends of the elongated active area is when the active area is formed by etching.

Therefore, based on the above-mentioned problems, there is a need for a method for preparing a semiconductor structure to reduce the damage to the edge of the active region caused by the etching process.

As shown in FIG. 1, the present disclosure provides a method for manufacturing a semiconductor structure, which includes:

S1: providing a substrate with a plurality of first trenches, and a first pattern is formed between two adjacent first trenches;

S2: forming a first dielectric layer, the first dielectric layer covers at least the sidewall of the first pattern; and S3: segment the first pattern to form a second pattern.

The method for preparing the semiconductor structure according to the present disclosure has the step of forming a first dielectric layer as a protective layer on the sidewalls of the first pattern in the substrate, and then segment the first pattern to form the second pattern, so as to obtain a structure composed of the second pattern. In this way, the second pattern constituting the active area comes from the first pattern, and the sidewalls of the first pattern are always protected by the first dielectric layer, so the end of the second pattern (which is the end of the source area) is not easily damaged during the segmentation process.

Figure 2:
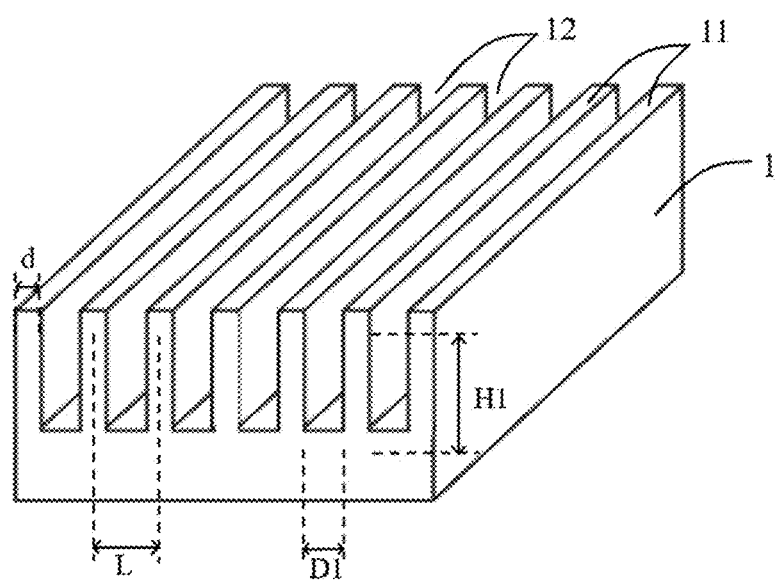
FIG. 2 shows a schematic diagram of a perspective view of the substrate having a plurality of first trenches obtained in step S2 according to an embodiment of the present disclosure.

Referring to FIG. 2. The Step S1 may include the detailed steps of: providing a substrate 1 and forming a plurality of first trenches 12 in the substrate 1 by etching, followed by forming the first pattern 11 between two adjacent ones of the plurality of first trenches 12.

As an example, the substrate 1 can be, but not limited to a silicon substrate, a gallium nitride substrate, a silicon-on-insulator or a silicon carbide substrate, etc. In this embodiment, the substrate 1 may be a silicon substrate. A doped well region by applying an ion implantation process may be formed in the substrate 1, and the doping type of the doped well region may be P-type or N-type.

As an example, the first trenches 12 and the first pattern 11 form a line array structure. Specifically, each line element of the first pattern 11 may be, but is not limited to, a rectangular wall-shaped structure; herein, lines in the array structure of the first pattern 11 are spaced apart, the first trenches 12 are formed between two adjacent lines of the first pattern 11; specifically, the lines of the first pattern 11 are arranged in parallel at intervals.

As an example, please refer to FIG. 2. In the process of step S1, the line width d of each line of the first pattern 11 along the horizontal direction of the substrate 1 can be set according to actual needs. It is worth noting that the line width d of the first pattern 11 is perpendicular to the line length of the line on the top surface of the first pattern 11, wherein this top surface is parallel to the substrate 1; preferably, the line width d of the first pattern 11 may be set ≤20 nm, and more specifically, the line width d of a line in the first pattern 11 may be 20 nm, 15 nm, or 10 nm, etc., within the line width range, the technical problem described in the present disclosure is more prominent, and the technical solution described in this embodiment has better economic efficiency and beneficial technical effects; the pitch distance L between two adjacent lines in the first pattern 11 may be set according to actual needs. Specifically, the pitch distance L between two adjacent lines of the first pattern 11 may be set at ≤30 nm, and more specifically, the pitch distance L between two adjacent lines of the first pattern 11 may be 30 nm, 25 nm, 20 nm, 15 nm or 10 nm and so on. It should be noted that the pitch distance between two adjacent lines of the first pattern 11 refers to the center-to-center distance (pitch) between two adjacent lines of the first pattern 11.

As an example, in process of step S1, a SADP (Self-Aligned Double Patterning) process or a SAQP (Self-Aligned Quadruple Patterning) process can be applied to form the plurality of lines in the first pattern 11 and the plurality of first trenches 12 in the line array structure on the substrate 1. The SADP process and the SAQP process are known to those skilled in the art and will not be repeated here.

Figure 3:
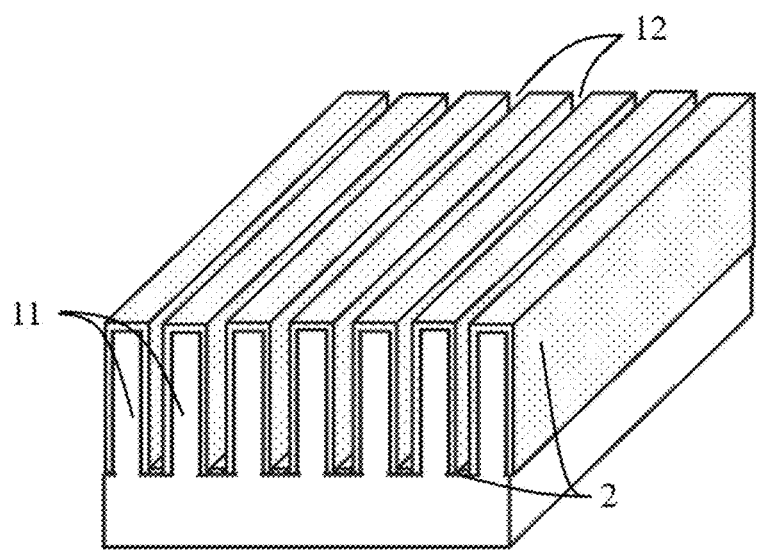
FIG. 3 shows a schematic diagram of a perspective view of the semiconductor structure obtained in step S21 according to an embodiment of the present disclosure.
Figure 5:
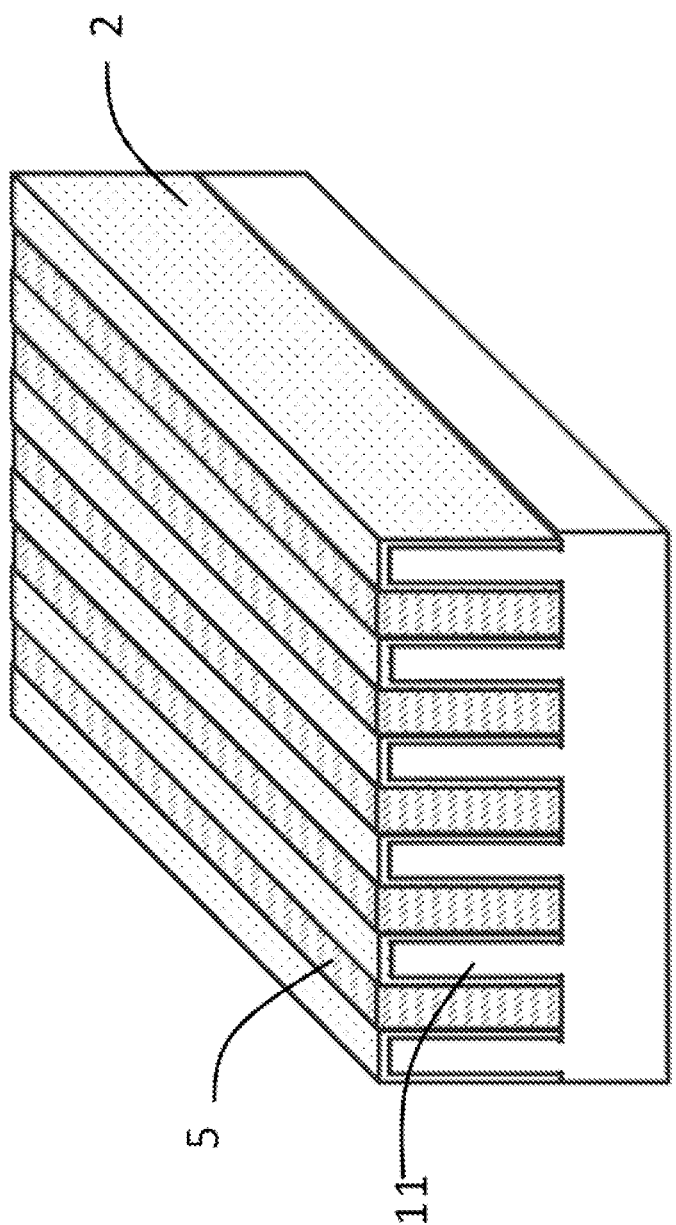
FIG. 5 shows a schematic diagram of the three-dimensional structure of the semiconductor structure obtained in step S22 according to an embodiment of the present disclosure.
Figure 9:
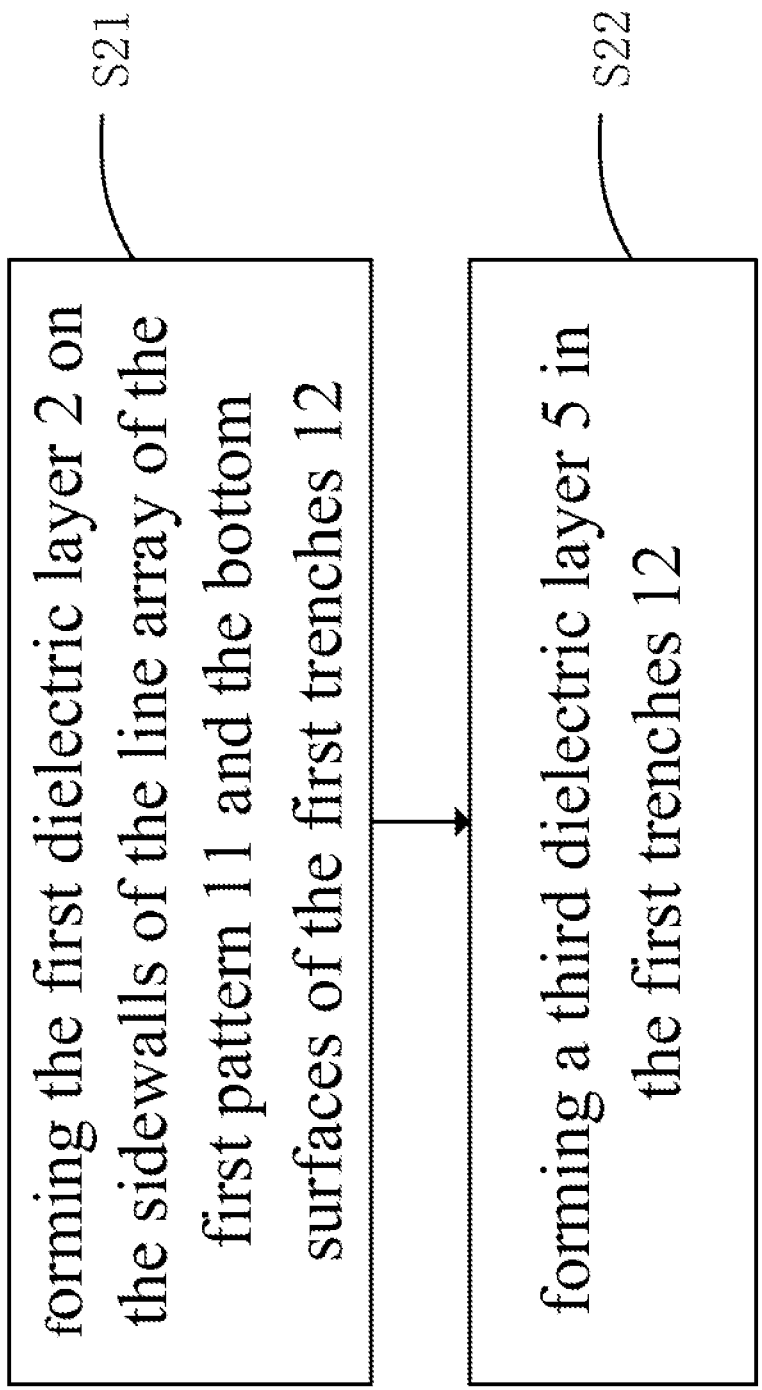
FIG. 9 is a flowchart of an exemplary method at step S2 according to an embodiment of the present disclosure.

In an example, referring to FIG. 9, step S2 may further include the following steps:

S21: forming the first dielectric layer 2 on the sidewalls of the line array of the first pattern 11 and the bottom surfaces of the first trenches 12; alternatively, the first dielectric layer 2 may also be formed on the sidewalls of the line array of the first pattern 11, the bottom surfaces of the first trenches 12, and the top surfaces of the lines in the first pattern 11, so that when the second trenches are subsequently formed in an etching process, the first dielectric layer 2 can effectively protect the surfaces of the lines in the first pattern 11. In this process, the thickness of the first dielectric layer 2 can be set according to actual needs. Specifically, the thickness of the first dielectric layer 2 is less than half of the width of one of the first trenches 12. In this process, after the first dielectric layer 2 is formed, there is a gap in the first trench 12, as shown in FIG. 3; preferably, the thickness of the first dielectric layer 2 is in the range of 1 nm-5 nm, within this range, the first dielectric layer 2 can not only provide sufficient protection for the first pattern 11, but also leave enough space for Subsequent filling of the third dielectric layer; and S22: forming and filling a third dielectric layer 5 in the first trenches 12; specifically, the third dielectric layer 5 fills the gaps left by the first dielectric layer 2 in the first trenches 12, as shown in FIG. 5.

More specifically, step S22 may include these exemplary steps:

S221: filling the third dielectric material layer into the first trenches 12 between the gaps left by the first dielectric layer 2 located on the sidewalls of the first pattern 11 and also located on the top surfaces of the first pattern 11 (not shown); specifically, the third dielectric material layer 5 is deposited by the techniques of, but not limited to, physical vapor deposition process, chemical vapor deposition process, atomic layer deposition process, or spin coating process; and S222: removing the third dielectric material layer 5 from the first dielectric layer 2 which covers the top surfaces of the lines of the first pattern 11, and leaving only the third dielectric material in the first trenches 12 as the third dielectric layer 5; specifically, the third dielectric material covering the first dielectric layer 2 on the top surfaces of the lines in the first pattern 11 is removed by a technique such as, but not limited to, the chemical mechanical polishing process. In another embodiment, the third dielectric material layer remains to be disposed on the first dielectric layer 2 on the top surfaces of the lines in the first pattern 11. The third dielectric material layer on the first dielectric layer 2 on the top surface of the first pattern 11 and the third dielectric material layer in the first trenches 12 are continuous and share one flat upper surface.

Figure 4:
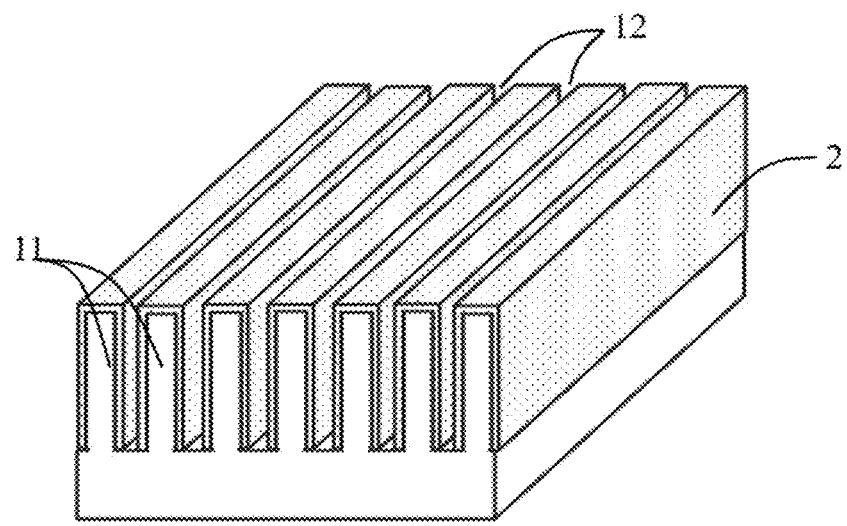
FIG. 4 shows a schematic diagram of a perspective view of the semiconductor structure obtained after removing the first dielectric layer from the bottom of the first trenches according to an embodiment of the present disclosure.

In one example, referring to FIG. 4, after forming the first dielectric layer 2 and before forming the third dielectric layer 5, the method further includes removing the first dielectric layer 2 located at the bottom surfaces of the first trenches 12. In this way, the first dielectric layer 2 is discontinuous at the bottom of the first trenches 12 into separated structures, to avoid too many carriers accumulate at the bottom of the first trenches 12, which can cause leakage current from holes or electrons accumulated near the first dielectric layer 2 in the transistor substrate. It is worth noting that the first dielectric layer 2 at the bottom of the first trenches 12 can be completely removed or partially removed. In this embodiment, all the first dielectric layer 2 at the bottom of the first trenches 12 is removed.

In another example, step S2 may include the following steps: forming a first dielectric layer 2 in the first trenches 12, herein the first dielectric layer 2 fills the first trenches 12. Specifically, a first dielectric material layer may be formed in the first trenches 12 and the top surfaces of the first pattern 11 first (not shown), and then is removed from the top surfaces of the lines in the first pattern 1 by a technique such as, but not limited to, a chemical mechanical polishing process. The first dielectric material remaining in the first trenches 12 is the first dielectric layer 2.

As an example, a physical vapor formation process, a chemical vapor formation process, an atomic layer formation process, or a thermal oxidation process can be used to form the first dielectric layer 2. The first dielectric layer 2 serves as a protective layer for the first pattern 11. The second dielectric layer 2 may include, but is not limited to, a silicon dioxide (SiO2) layer, a silicon monoxide (SiO) layer, a silicon nitride (SiN) layer, or a silicon oxynitride (SiON) layer, etc. In this embodiment, the first dielectric layer 2 can be a silicon dioxide layer.

As an example, a physical vapor deposition process, a chemical vapor deposition process, an atomic layer deposition process, or a spin coating process may be used to form the third dielectric layer 5, and the material of the third dielectric layer 5 is different from the material of the first dielectric layer 2. In this embodiment, the third dielectric layer 5 may include, but is not limited to, a silicon dioxide layer. Specifically, the hardness of the first dielectric layer 2 is greater than the hardness of the third dielectric layer 5, so that the first dielectric layer 2 provides good protection for the first pattern 11. At the same time, under the same etching conditions, the removal rate of the third dielectric layer 5 is greater than the removal rate of the first dielectric layer 2, so as to ensure that when the third dielectric layer 5 is removed, the first dielectric layer 2 on the upper surface of the first pattern 11 is hardly removed.

Figure 10:
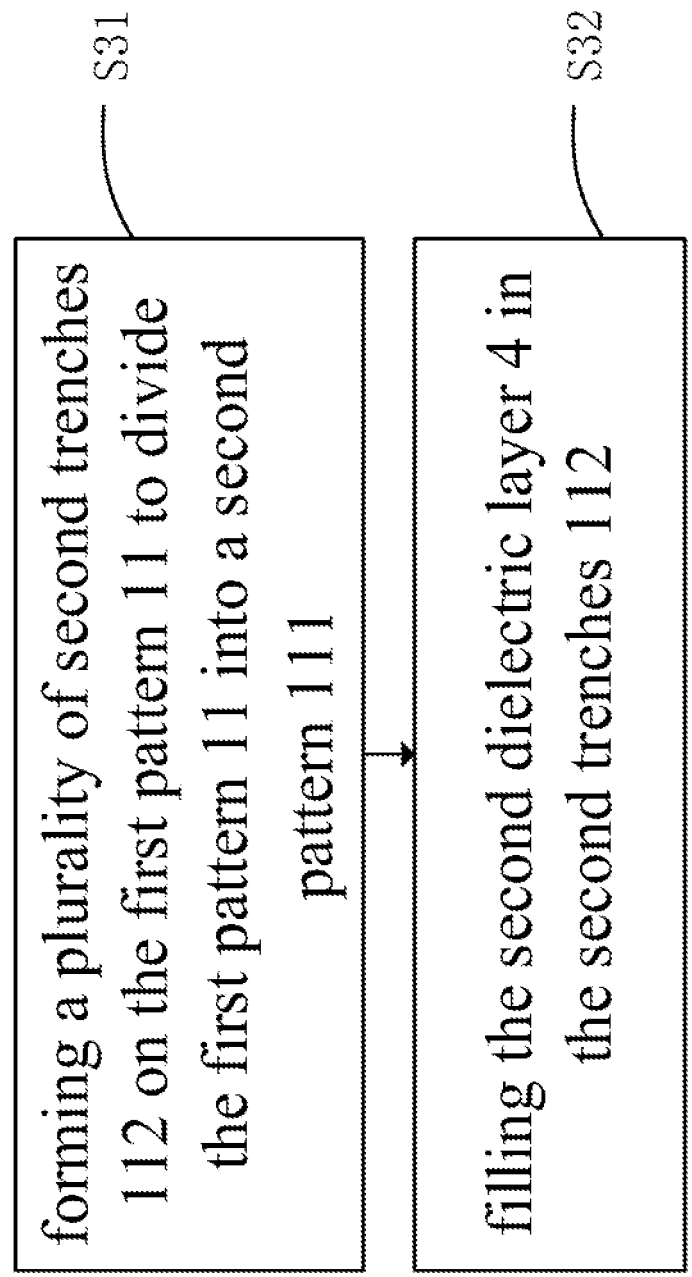
FIG. 10 is a flowchart of an exemplary method at step according to an embodiment of the present disclosure.

FIG. 10 discloses more details of step S3:

S31: forming a plurality of second trenches 112 on the first pattern 11 to divide the first pattern 11 into a second pattern 111.

Figure 6:
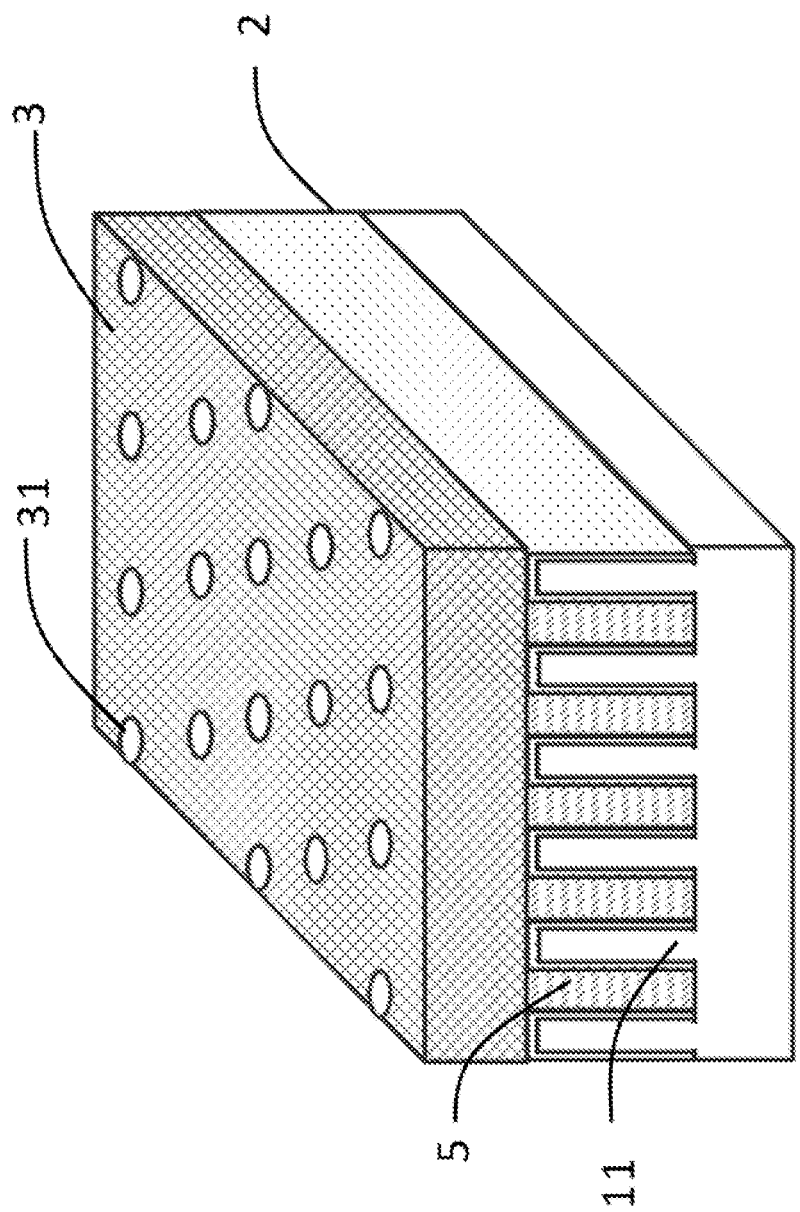
FIG. 6 is a schematic diagram of the three-dimensional structure of the semiconductor structure obtained in step S312 according to an embodiment of the present disclosure.
Figure 7:
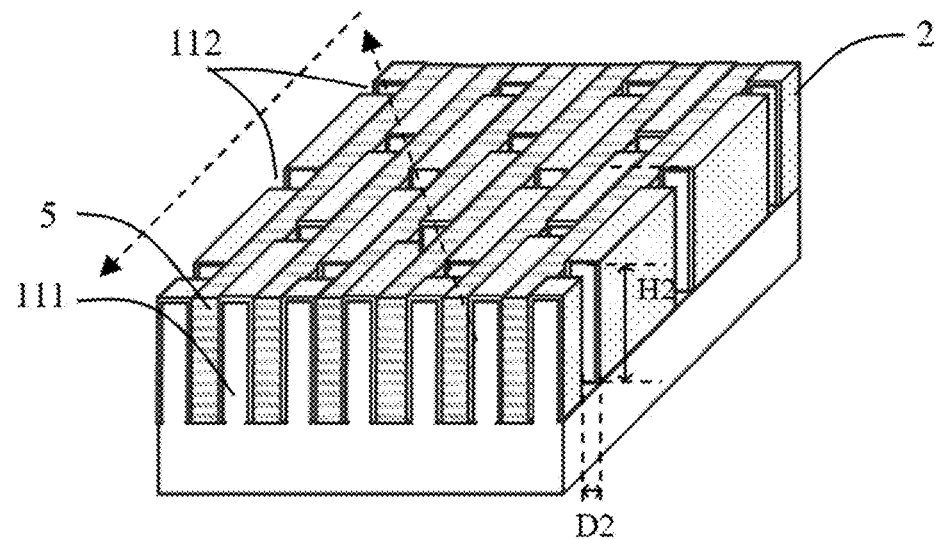
FIG. 7 shows a schematic diagram of the three-dimensional structure of the semiconductor structure obtained in step S314 according to an embodiment of the present disclosure.

As an example, step S31 may include the following steps:

S311: forming a mask layer on the upper surface of the substrate 1:

S312: performing a patterning process on the mask layer to obtain a patterned mask layer 3. The patterned mask layer 3 includes a plurality of openings 31 penetrating through the mask layer, and the openings 31 define the positions and shapes of the second trenches 112 as shown in FIG. 6. Optionally, the shapes of the openings 31 can be circles, ellipses or rectangles, etc.;

S313: etching the first pattern 11 based on the patterned mask 3 to form the plurality of second trenches 112 on the first pattern 11 to divide each line in the first pattern 11 into the a number of second patterns 112;

S314: removing the patterned mask layer 3, as shown in FIG. 7.

As an example, in step S311, the mask layer 3 may include, but is not limited to, an amorphous carbon layer, a silicon oxynitride layer, a silicon oxide layer, or a combination of at least two of the above layers. As examples, to form the mask layer one of the techniques may be applied such as a physical vapor formation process, a chemical a vapor phase formation process, an atomic layer formation process, and a spin coating process.

As an example, in step S312, the mask layer 3 may be patterned by a photolithography process; the dimension of the openings 31 is larger than the width of each line in the first pattern 11. Specifically, the dimension of the openings 31 may be, along the width of the line of the first pattern 11, or along the maximum dimension parallel to the substrate of the line in the first pattern 11. For example, the width of a line in the first pattern 11 is less than or equal to 20 nm, the size of one of the second trenches 112 is less than or equal to 15 nm, the thickness of the first dielectric layer 2 ranges from 1 nm to 5 nm, and the size of one of the openings 31 is less than 30 nm. The opening size being larger than each line width of the first pattern 1 is beneficial because it increases the process window and improves the product yield. It should be noted that the size of each of the second trenches 112 may be the size along the width direction of one line in the first pattern 11, or the maximum size along any direction in the plane parallel to the top surface of the substrate.

As an example, in step S313 (not shown in the figures), a dry etching process may be used to pattern the first pattern 11 with the mask layer 3. In another example, the second trenches 112 segment the first pattern 11 only, but do not cut the first dielectric layer 2 which covers the sidewalls of the lines in the first pattern 11. Specifically, an etching process is applied on the openings 31 and with an etchant having an etch selection ratio being greater than 8 between the first pattern 11 and the first dielectric layer 2. The etching process on the first pattern 11 forms the second trenches 112, resulting in a second pattern 111 formed between the first trenches 12 and the second trenches 112. The first dielectric layer 2 on the sidewalls of the second patterns adjacent to the second trenches 112 is not etched. By etching and segmenting only the first pattern 11 with the high etch selection ratio process, the first dielectric layer 2 is left intact, which ensures better end shapes of the second pattern 111, thereby improving the device performance.

As an example, in step S314 (not shown in figures), an etching process or a chemical mechanical polishing process may be used to remove the patterned mask layer 3.

Please refer to FIG. 7, according to one of the embodiments: the extending direction of the lines in the first pattern 11 obliquely intersects the line crossing the closest second trenches 112 in adjacent rows. Specifically, the second trenches 112 on the same line of the first pattern 11 are arranged at intervals, and the second trenches 112 on the adjacent lines of the first pattern 11 are arranged in a staggered way. More specifically, the second trenches 112 located in odd-numbered columns in the first pattern 11 are arranged in a staggered way with the second trenches 112 located in the adjacent even-numbered columns in the first pattern 11. The second trenches 112 located in odd-numbered columns in the first pattern 11 are aligned perpendicular to lines of the first pattern 11, in one-to-one correspondence, and the second trenches 112 in even-numbered columns in the first pattern 11 are aligned perpendicular also to lines of the first pattern 11, in a one-to-one correspondence. Specifically, the first pattern forms the active areas of the storage devices, and the above arrangement is beneficial to maximize the device storage density.

According to another embodiment, in FIGS. 2 and 7, the depth 141 of one of the first trenches 12 may be greater than or equal to the depth H2 of one of the second trenches 112. In this embodiment, the depth H1 of one of the first trenches 12 may be greater than the depth H2 of one of the second trenches 112. The depth H1 of one of the first trenches 12 being greater than the depth H2 of one of the second trenches 112 isolates adjacent active regions better and avoid the mutual influence effect between the. Specifically, the first trenches 12 can be etched separately through the above process, the second trenches 112 will be etched later, that is, different depths in H1 of the first trenches 12 and 112 of the second trenches 112 are achieved by twice etching.

According to another embodiment, in FIGS. 2 and 7, the width D1 of one of the first trenches 12 is narrower than or equal to the width D2 of one of the second trenches 112. In this embodiment, the width D1 of one of the first trenches 12 is less than the width D2 of one of the second trenches 112. It is worth noting that the width of one of the second trenches 112 refers to the dimension along the extending direction of the lines in the first pattern 11. The maximum dimension of the second trenches 112 in a plane parallel to the substrate 1 is less than 15 nm.

Figure 8:
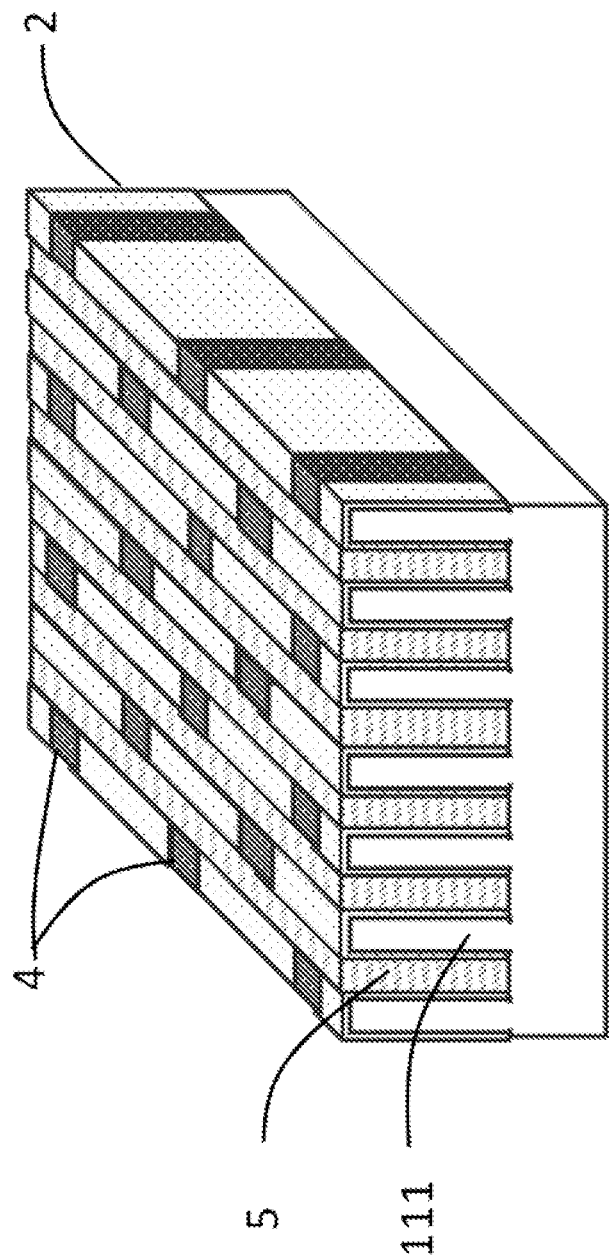
FIG. 8 shows a schematic diagram of a perspective view of the semiconductor structure obtained in step S32 according to an embodiment of the present disclosure.

In an example, after the second pattern 111 is formed, S32 further includes: filling the second dielectric layer 4 in the second trenches 112, as shown in FIG. 8.

As an example, the second dielectric layer 4 can be formed by a number of techniques such as, but not limited to, a physical vapor formation process, a chemical vapor formation process, or an atomic layer formation process. The second dielectric layer 4 may compose the same material as the first dielectric layer 2, or it can be different from the first dielectric layer 2. The material of the second dielectric layer 4 and the material of the third dielectric layer 5 can be the same or different. When the material of the second dielectric layer 4 and the first dielectric layer 2 are different, the second dielectric layer 4 may include materials such as, but not limited to, a silicon oxide layer or a silicon nitride (SiN) layer. When the material of the second dielectric layer 4 is different from the material of the third dielectric layer 5, the viscosity of the second dielectric layer 4 is lower than that of the third dielectric layer 5. The first trenches 12 and the second trenches 112 are respectively filled with the third dielectric layer 5 and the second dielectric layer 4 which have different viscosities, ensuring the filling quality and the isolation performance.

it should be noted that, according to other embodiments, if the solution is to fill the first dielectric layer 2 into the first trenches 12 before filling into the second trenches 112 with the second dielectric layer 4, it may also include the step of removing the first dielectric layer 2 from the trenches 12, at this time, filling the second dielectric layer 4 into the second trenches 112 includes filling the first trenches 12 with the second dielectric layer 4. If the solution is to fill the first trenches 12 with the third dielectric layer 5, before filling the second dielectric layer 4 into the second trenches 112, it may also include a step of removing the third dielectric layer 5 from the first trenches 12, at this time, filling the second dielectric layer 4 into the second trenches 112 includes filling the first trenches 12 with the second dielectric layer 4.

The preparation process of the disclosure is simple and has a broad prospect for applications in the semiconductor manufacturing field, so effectively overcoming the shortcomings in the current techniques and having a high industrial value.

The exemplary embodiments of the present disclosure also provide a semiconductor structure. The semiconductor structure may be formed by the method described in the above embodiments. Other methods may also be used.

The semiconductor structure includes: a substrate 1; a number of first trenches 12 and a number of second trenches 112 both located on the substrate 1; a second pattern 111 located between the first trenches 12 and the second trenches 112; the first dielectric layer 2, covering at least the sidewalls of the second pattern 11l adjacent to the first trenches 12; the second dielectric layer 4, filling the second trenches 112.

In one of the examples, the substrate 1 includes, but is not limited to, a silicon substrate, a gallium nitride substrate, a silicon-on-insulator, or a silicon carbide substrate, etc. In this embodiment, the substrate 1 may be a silicon substrate. A doped well region formed with an ion implantation process may be formed in the substrate 1, and the dopant type of the doped well region may be either P-type or N-type.

In one example, the depth H1 of one of the first trenches 12 may be greater than or equal to the depth H2 of one of the second trenches 112. In this embodiment, the depth H1 of one of the first trenches 12 being greater than the depth 112 of one of the second trenches 112 makes the isolation better, so to avoid mutual influence between adjacent active areas.

In one of the examples, the material of the second dielectric layer 4 may be the same as the material of the first dielectric layer 2, or may be different from the material of the first dielectric layer 2. When the materials of the second dielectric layer 4 and the first dielectric layer 2 are different, the second dielectric layer 4 may include, but is not limited to, a silicon oxide layer or a silicon nitride (SiN) layer.

In another embodiment, the width of each element of the second pattern 111 is less than or equal to 20 nm. It is worth noting that the width of each element of the second pattern 111 is the length of the cross section perpendicular to the extension direction of the second pattern 111 in the plane parallel to the substrate 1. Specifically, the width of each element of the second pattern 111 may be 20 nm, 15 nm, or 10 nm, etc.. Within the width range, the technical problem described in the present disclosure is more prominent, and the technical solution described in this embodiment will be more economical and more beneficial. The spacings between adjacent elements in the second pattern 111 can be set according to actual needs.

In another embodiment, the sidewalls of each element of the second pattern 111 adjacent to any one of the second trenches 112 are not covered with the first dielectric layer 2.

In another embodiment, the distance between two adjacent elements of the second pattern 111 is ≤30 nm. More specifically, the distance between adjacent elements of the second pattern 111 may be 30 nm, 25 nm, 20 nm, 15 nm, or 10 nm, etc., but in other implementations in some examples, the distance between two adjacent elements in the second pattern 111 is not limited to the above-mentioned numbers. It should be noted that the distance between two adjacent elements in the second pattern 111 mentioned here refers to the center-to-center distance between two adjacent elements of the second pattern 111.

In another embodiment, the maximum dimension of one of the second trenches 112 in a plane parallel to the substrate 1 is less than 15 nm.

In another embodiment, the semiconductor structure further includes a third dielectric layer 5, and the third dielectric layer 5 fills in the first trenches 12.

In one example, the material of the third dielectric layer 5 is different from the material of the first dielectric layer 2. In this embodiment, the third dielectric layer 5 may include, but is not limited to, a silicon dioxide layer.

In one example, the material of the second dielectric layer 4 and the material of the third dielectric layer 5 may be the same or different. When the material of the second dielectric layer 4 is different from the material of the third dielectric layer 5, the second dielectric layer 4 The viscosity is lower than that of the third dielectric layer 5. The first trench 12 and the second trench 112 are respectively filled by the third dielectric layer 5 and the second dielectric layer 4 with different viscosities, which can ensure both the filling effect and the isolation performance. Specifically, the width of the first pattern 11 is less than or equal to 20 nm, the distance between adjacent first pattern 11 is less than or equal to 30 nm, the size of the second trench 112 is less than or equal to 15 nm, and the thickness of the first dielectric layer 2 ranges from 1 nm to 5 nm. The spin coating process fills the first trench 12 and the second trench 112. Since the filling difficulty of the second trench 112 is higher than that of the first trench 12, the second trench 112 is filled with a second dielectric layer 4 with a low viscosity. Filling can obtain a better filling effect, and the first trench 12 can be filled with a high-viscosity third dielectric layer 5 to obtain better isolation performance. It should be noted that the size of the second trench 112 may be the size along the width direction of the first pattern 11, or the maximum size along the horizontal direction of the substrate.

In another example, the first dielectric layer 2 also is present between the adjacent elements of the second pattern 111 and is integrated with the first dielectric layer 2 on the sidewall of each element of the second pattern 111. Specifically, one of the second trenches 112 only segments a line of the first pattern 11, and the first dielectric layer 2 covering the sidewalls of the line of the first pattern 11 is not segmented. Etching into the openings 31 with an etchant having etch selection ratio greater than 8 between the first pattern 11 and the first dielectric layer 2, the first pattern 11 is patterned to form the second trenches 112. The second pattern 111 is formed between the first trenches 12 and the second trenches 112 after this etching process. The first dielectric layer 2 on the sidewalls of each element in the second pattern 111 adjacent to the second trenches 112 is not segmented by this etching. In the high etch selection ratio process, only the first pattern 11 is segmented and the first dielectric layer 2 is left intact, so the end shape of elements in the resultant second pattern 111 will be better ensured, thereby improving the device performance.

It should be understood that, although the steps disclosed in the flowcharts, as shown in FIG. 1, FIGS. 9 and 10, are displayed in sequence as indicated by the arrows in these drawings, these steps are not necessarily performed in the same order. Unless there is a clear description in this disclosure, no strict order for executing these steps, so these steps can be executed in another order. Moreover, at least some of the steps in the flow charts may include multiple steps or multiple stages. These steps or stages are not necessarily executed at the same time, instead can be executed at different times, and the order of execution of these steps or stages can be also different. They do not have to be performed in the same sequence, but may be performed alternately or interchangeably with other steps or other stages.

The technical features of the above-mentioned embodiments can be combined in any ways necessary. In order to describe the disclosure concisely, not all possible combinations of the various technical features in the above-mentioned embodiments are described. However, as long as there is no contradiction in combining these technical features, all should be considered as within the scope of this specification.

The above-mentioned descriptions only show several embodiments of the present disclosure, and the descriptions are relatively specific and detailed, but these should not be interpreted as limiting the scope of the disclosure. It should be pointed out that for those of ordinary skill in the art, without departing from the concept of the present disclosure, modifications and improvements can be made, which will all fall within the protective scope of the present disclosure. Therefore, the present disclosure intends to cover various modifications and equivalent arrangements included in the spirit and scope of the appended claims.

The invention claimed is:

1. A method for manufacturing a semiconductor structure, comprising:
   providing a substrate, wherein the substrate comprises a plurality of first trenches;
   forming a first pattern, wherein the first pattern comprises an array of lines each disposed between two adjacent ones of the plurality of first trenches;
   forming a first dielectric layer, wherein the first dielectric layer covers at least sidewalls of the array of lines of the first pattern; and
   segmenting the first pattern to form a second pattern, wherein forming the first dielectric layer covering the at least the sidewalls of the first pattern further comprises:
   forming the first dielectric layer on the sidewalls of the array of lines of the first pattern and bottom surfaces of the plurality of first trenches, and
   removing the first dielectric layer from the bottom surfaces of the plurality of first trenches, and wherein after forming the first dielectric layer covering the sidewalls of the first pattern and before segmenting the first pattern, the method further comprises:
   forming a third dielectric layer in the plurality of first trenches, wherein the third dielectric layer fills the plurality of first trenches.

2. The method of manufacturing the semiconductor structure according to claim 1, wherein a width of one line of the array of lines in the first pattern is less than or equal to 20 nm, and wherein a distance between two adjacent lines of the array of lines in the first pattern is less than or equal to 30 nm.

3. The method of manufacturing the semiconductor structure according to claim 1, wherein segmenting the first pattern to form the second pattern further comprises:
   dividing, with a plurality of second trenches, each of the lines in the array of the first pattern into a plurality of elements in the second pattern; and
   filling a second dielectric layer in the plurality of second trenches.

4. The method for manufacturing the semiconductor structure according to claim 3, wherein:
- a material of the third dielectric layer is different from a material of the first dielectric layer, and
- the material of the third dielectric layer is a same as a material of the second dielectric layer.

5. The method for manufacturing the semiconductor structure according to claim 3, wherein:
- a material of the third dielectric layer is different from a material of the second dielectric layer, and
- a viscosity of the second dielectric layer is lower than a viscosity of the third dielectric layer.

6. The method for manufacturing the semiconductor structure according to claim 5, wherein a maximum dimension of one of the plurality of second trenches in a plane parallel to the substrate is less than 15 nm.

7. The method of manufacturing the semiconductor structure according to claim 3, wherein:
- dividing each of the lines in the array of the first pattern into the plurality of elements in the second pattern comprises forming a mask layer on the first pattern, wherein the mask layer is patterned to include a plurality of openings penetrating through the mask layer, wherein the plurality of openings defines locations and shapes of the plurality of second trenches on the first pattern;
- the shapes of the openings are circles, ellipses, or rectangles; and
- the first pattern is etched based on the mask layer to divide each of the lines of the array in the first pattern into a plurality of elements in the second pattern.

8. The method of manufacturing the semiconductor structure according to claim 3, wherein an extending direction of the lines in the first pattern obliquely intersects a line crossing a closest one of the plurality of second trenches in adjacent rows.

9. The method of manufacturing the semiconductor structure according to claim 3, wherein:
- a depth of one of the plurality of first trenches is greater than a depth of one of the plurality of second trenches, and
- a width of one of the plurality of first trenches is smaller than a width of one of the plurality of second trenches.

10. The method of manufacturing the semiconductor structure according to claim 1, wherein the array of lines in the first pattern are arranged in parallel and spaced apart.

11. A semiconductor structure, comprising:
- a substrate; and
- a second pattern disposed on the substrate, wherein the second pattern is formed by a method comprising:
- disposing a plurality of first trenches on the substrate;
- forming a first pattern, wherein the first pattern comprises an array of lines each disposed between two adjacent ones of the plurality of first trenches;
- forming a first dielectric layer, wherein the first dielectric layer covers at least sidewalls of the array of lines of the first pattern; and
- segmenting the first pattern to form the second pattern, wherein forming the first dielectric layer covering at least the sidewalls of the first pattern further comprises:
  - forming the first dielectric layer on the sidewalls of the array of lines of the first pattern and bottom surfaces of the plurality of first trenches, and
  - removing the first dielectric layer from the bottom surfaces of the plurality of first trenches, and wherein after forming the first dielectric layer covering the sidewalls of the first pattern and before segmenting the first pattern, the method further comprises:
  - forming a third dielectric layer in the plurality of first trenches, wherein the third dielectric layer fills the plurality of first trenches.

12. The semiconductor structure of claim 11, wherein:
- a width of the first pattern is less than or equal to 20 nm, and
- a distance between two adjacent lines in the first pattern is less than or equal to 30 nm.

13. The semiconductor structure of claim 11, wherein segmenting the first pattern to form the second pattern further comprises:
- dividing, with a plurality of second trenches, each of in the array of the first pattern into a plurality of elements in the second pattern; and
- filling a second dielectric layer in the plurality of second trenches.

14. The semiconductor structure of claim 13, wherein the first dielectric layer does not cover sidewalls of each element of the second pattern adjacent to the plurality of second trenches.

15. The semiconductor structure of claim 13, wherein a maximum dimension of one of the plurality of second trenches in a plane parallel to a top surface of the substrate is less than 15 nm.

16. The semiconductor structure of claim 13, wherein a material of the third dielectric layer is different from a material of the second dielectric layer, and wherein a viscosity of the second dielectric layer is lower than a viscosity of the third dielectric layer.

17. The semiconductor structure of claim 13, wherein the first dielectric layer is present between adjacent elements in the second pattern, and wherein the first dielectric layer present between the adjacent elements is integrated with the first dielectric layer on sidewalls of each element in the second pattern adjacent to the plurality of first trenches.

18. The semiconductor structure of claim 13, wherein:
- a material of the third dielectric layer is different from a material of the first dielectric layer,
- the material of the third dielectric layer is a same as a material of the second dielectric layer.

19. The semiconductor structure of claim 13, wherein:
- a depth of one of the plurality of first trenches is greater than a depth of one of the plurality of second trenches, and
- a width of one of the plurality of first trenches is smaller than a width of one of the plurality of second trenches.

* * * * *